United States Patent
Lee et al.

(10) Patent No.: US 7,834,352 B2
(45) Date of Patent: Nov. 16, 2010

(54) METHOD OF FABRICATING THIN FILM TRANSISTOR

(75) Inventors: Tae Woo Lee, Seoul (KR); Young Hun Byun, Gyeonggi-do (KR); Yi Yeol Lyu, Daejeon-si (KR); Sang Yoon Lee, Seoul (KR); Bon Won Koo, Gyeoggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 97 days.

(21) Appl. No.: 11/972,847

(22) Filed: Jan. 11, 2008

(65) Prior Publication Data

US 2008/0135839 A1 Jun. 12, 2008

Related U.S. Application Data

(62) Division of application No. 11/142,502, filed on Jun. 2, 2005, now Pat. No. 7,341,897.

(30) Foreign Application Priority Data

Oct. 27, 2004 (KR) .............................. 2004-86229

(51) Int. Cl.
*H01L 31/00* (2006.01)
(52) U.S. Cl. ................. 257/59; 438/158; 257/E21.561
(58) Field of Classification Search ......... 438/151–166; 257/59–63, 347–354, E21.561
See application file for complete search history.

(56) References Cited

U.S. PATENT DOCUMENTS

| | | | |
|---|---|---|---|
| 4,459,739 A * | 7/1984 | Shepherd et al. | 438/157 |
| 5,470,768 A * | 11/1995 | Yanai et al. | 438/161 |
| 5,946,551 A * | 8/1999 | Dimitrakopoulos et al. | 438/99 |
| 6,472,705 B1 * | 10/2002 | Bethune et al. | 257/314 |
| 7,306,968 B2 * | 12/2007 | Brabec et al. | 438/99 |
| 2006/0102891 A1 * | 5/2006 | Brabec et al. | 257/40 |

FOREIGN PATENT DOCUMENTS

WO WO-2004025746 * 3/2004

OTHER PUBLICATIONS

Francis Garnier, All-Polymer Field-Effect Transistor Realized by Printing Techniques, Sep. 16, 1994, pp. 1684-1686, vol. 265, Science.
H. Koezuka et al., Polythiophene Field-Effect Transistor With Polypyrrole Worked as Source and Drain Electrodes, Apr. 12, 1993, pp. 1794-1796, vol. 62 (15), Applied Physics Letters.
H. Fuchigami et al., Polythienylenevinylene Thin-Film Transistor With High Carrier Mobility, Sep. 6, 1993, pp. 1372-1374, vol. 63 (10), Appl. Physics. Letters.
Gilles Horowitz, An Analytical Model for Organic-Based Thin-Film Transisitors, Jul. 1, 1991, pp. 469-475, vol. 70 (1), J. Applied Physics.
Giles Horowitz, Charge Transport in Polycrystalline Oligothiaophene Thin Film Transistors, pp. 1349-1350, vol. 121 2001.

* cited by examiner

*Primary Examiner*—Richard A. Booth
(74) *Attorney, Agent, or Firm*—Harness, Dickey & Pierce, P.L.C.

(57) ABSTRACT

A method of fabricating a thin film transistor, in which source and drain electrodes are formed through a solution process, even all stages which include formation of electrodes on a substrate, formation of an insulator layer, and formation of an organic semiconductor layer are conducted through the solution process. In the method, the fabrication is simplified and a fabrication cost is reduced. It is possible to apply the organic thin film transistor to integrated circuits requiring high speed switching because of high charge mobility.

14 Claims, 3 Drawing Sheets

METHOD OF FABRICATING THIN FILM TRANSISTOR

BACKGROUND OF THE INVENTION

1. Field of the Invention

The embodiments of present invention relate, in general, to a method of fabricating a thin film transistor and, more particularly, to a method of fabricating a thin film transistor adopting a solution process, in which metal patterns are formed through photo-reduction using a metal precursor dissolved in a solvent, thereby forming source and drain electrodes employed in the transistor. In more detail, the present invention pertains to a method of fabricating an organic thin film transistor, in which an electrode, an insulating layer, and a semiconductor layer are all formed through a solution process, thus it is possible to fabricate the organic thin film transistor having high charge mobility while the entire process is simplified and the fabrication cost is reduced.

2. Description of the Prior Art

Recently, studies have frequently been made of polymer materials as novel electric and electronic materials in wide fields, including functional electronic devices or optical devices, because the polymer materials can be easily shaped into fibers or films and are flexible and conductive, and because their fabrication costs are low. Of the devices using the conductive polymer, an organic thin film transistor employing organics as an active semiconductor layer has been studied since the year 1980, and many studies with respect to it are in progress over the whole world. The organic thin film transistor is advantageous in that, since it is possible to fabricate it through simple technology, such as printing technology, the fabrication costs are low and it has fair processability and compatibility to flexible substrates.

Nowadays, it is predicted that the organic thin film transistor will be applied to driving devices of active displays, or plastic chips for smart cards and inventory tags.

The organic semiconductor thin film transistor employs polymer or oligomer as active material, which is a contrast to conventional amorphous silicon and polysilicon thin film transistors [F. Garnier et al., Science, Vol. 265, pp. 1684-1686; H. Koezuka et al., Applied Physics Letters, Vol. 62(15), pp 1794-1796; H. Fuchigami et al., Applied Physics Letters, Vol. 63(10), pp. 1372-1374; G. Horowitz et al., J. Applied Physics, Vol. 70(1), pp. 469-475; G. Horowitz et al., Synthetic Metals, Vol. 42043, pp. 1127-1130].

Conventional technology employing a solution process to fabricate an organic semiconductor thin film transistor has been suggested, but mainly applied to polymer and P-type organic semiconductors. The polymer semiconductors used to fabricate the organic thin film transistor are characterized by dissolution in an organic solvent, but low molecular weight organic semiconductors are characterized by being unsuitable for the solution process, thus it is nearly impossible to apply the solution process to low molecular weight organic semiconductors.

Furthermore, in a conventional method of fabricating the organic thin film transistor, electrodes are formed through a vacuum deposition process, but this method is problematic in that permeation and diffusion of metal occur in the course of forming source and drain electrodes, thus an insulator layer (for a bottom-contact structure) or an organic semiconductor layer (for a top-contact structure) is damaged.

Even though the organic thin film transistor has notable advantages in that, since it can be fabricated through a low-priced process, such as spin coating, spray coating, or ink-jet printing technology, the fabrication is simple and fabrication cost is low, it is used sparingly in applications in which high speed response and low voltage driving are required because charge mobility is low. Accordingly, there remains a need to develop an organic thin film transistor having high charge mobility.

OBJECTS AND SUMMARY

Accordingly, the embodiments of the present invention have been made keeping in mind the above problems occurring in the art, and an object of embodiments of the present invention is to provide a method of fabricating a thin film transistor, in which source and drain electrodes as well as an insulator layer and an organic semiconductor layer are formed through a solution process, thereby simplifying the fabrication and reducing the fabrication cost.

Another object of embodiments of the present invention is to provide a method of fabricating an organic thin film transistor, in which a derivative of fullerene, used as material for an organic semiconductor layer and belonging to N-type semiconductor material, is employed, thereby improving charge mobility. The derivative of fullerene is preferably [6,6]-phenyl-$C_{61}$ butyric acid methyl ester (F[5,6]), or methanofullerene (1-(3-methoxycarbonyl)propyl-1-phenyl [6,6]$C_{61}$ (M [6,6])).

According to an aspect of embodiments of the present invention, the above objects can be accomplished by providing a method of fabricating a thin film transistor, in which a substrate, a gate electrode, an insulator layer, source and drain electrodes, and a semiconductor layer are sequentially formed. The method comprises applying a coating solution, in which a metal precursor is dissolved in a solvent, on the insulator layer, and forming the source and drain electrodes through photo-reduction.

According to another aspect of embodiments of the present invention, the above objects can be accomplished by providing a method of fabricating a thin film transistor, in which a substrate, a gate electrode, a gate insulator layer, a semiconductor layer, and source and drain electrodes are sequentially formed. The method comprises applying a coating solution, in which a metal precursor is dissolved in a solvent, on the semiconductor layer, and forming the source and drain electrodes through photo-reduction.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Hereinafter, a detailed description will be given of embodiments of the present invention, with reference to the accompanying drawings.

Figure 1:
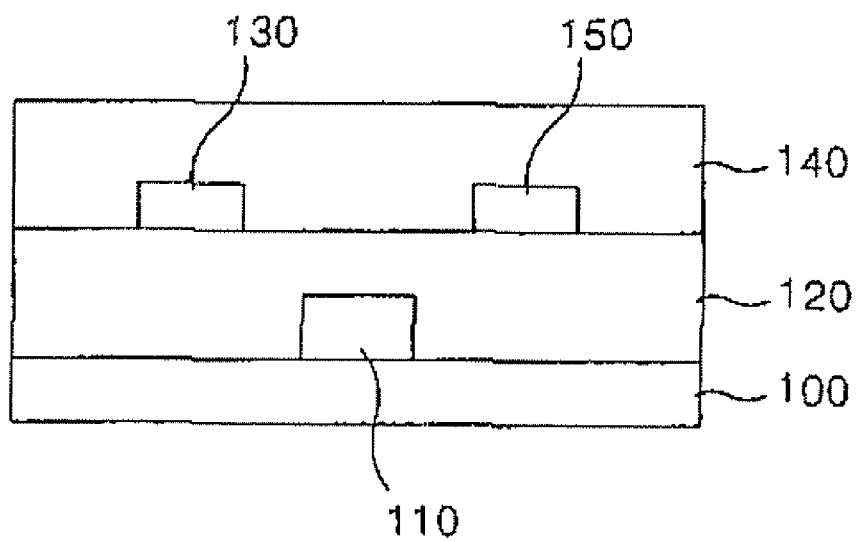
FIG. 1 is a schematic sectional view of an organic thin film transistor having a bottom-contact structure, which is fabricated according to a first embodiment of the present invention.

A method of fabricating a thin film transistor of the present invention may be applied to both a bottom-contact structure and a top-contact structure. FIG. 1 is a schematic sectional view of a thin film transistor having a bottom-contact structure, which is fabricated according to a first embodiment of the present invention, and FIG. 2 is a schematic sectional view of an organic thin film transistor having a top-contact structure, which is fabricated according to a second embodiment of the present invention.

Referring to FIG. 1, in the bottom-contact structure, a gate electrode 110 is formed on a substrate 100, a gate insulator layer 120 is layered on the gate electrode 110, a source electrode 130 and a drain electrode 150 are formed thereon, and a semiconductor layer 140 is formed on the resulting structure.

Figure 2:
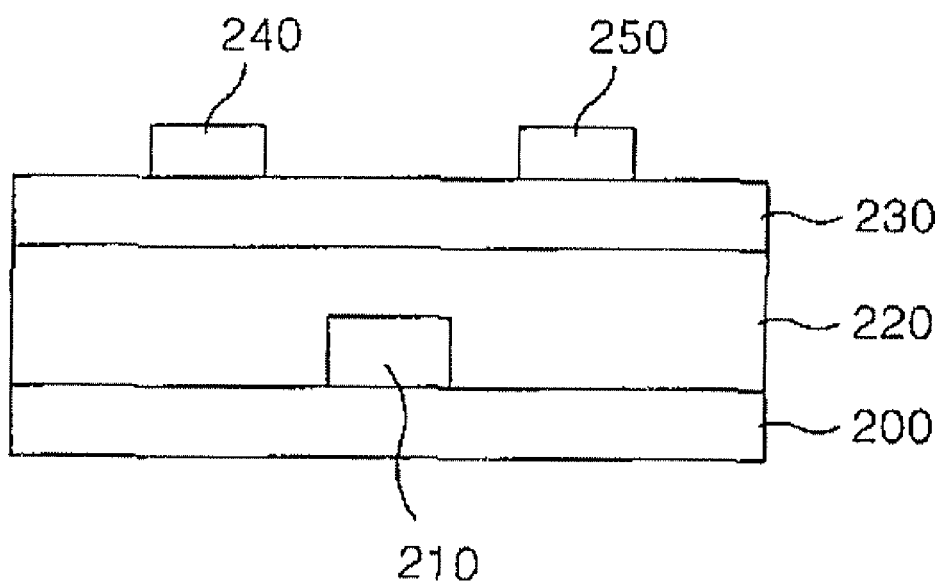
FIG. 2 is a schematic sectional view of an organic thin film transistor having a top-contact structure, which is fabricated according to a second embodiment of the present invention.

Meanwhile, with reference to FIG. 2, in the top-contact structure, a gate electrode 210 is formed on a substrate 200, a gate insulator layer 220 is layered on the gate electrode 210, a semiconductor layer 230 is formed thereon, and a source electrode 240 and a drain electrode 250 are simultaneously formed in parallel on the resulting structure.

Embodiments of the present invention are characterized in that coating is conducted using a metal precursor dissolved in a solvent and, preferably, pure metal patterns are formed through photo-reduction to form the gate electrode, the source electrode, and the drain electrode shown in FIGS. 1 and 2.

According to an aspect of embodiments of the present invention, there is provided a method of fabricating a thin film transistor having a bottom-contact structure in which a substrate, a gate electrode, an insulator layer, source and drain electrodes, and a semiconductor layer are sequentially formed. The method is characterized in that, after a coating solution in which a metal precursor is dissolved in a solvent is applied on the insulator layer, the source and drain electrode are formed through photo-reduction in the course of fabricating the thin film transistor. Layers other than the source and drain electrodes may be formed through a conventional method, such as vacuum deposition, or a solution process. Particularly, the formation of the gate electrode may be conducted through the solution process, and preferably, after the coating solution, in which the metal precursor is dissolved in the solvent, is applied on the substrate, the gate electrode is formed through photo-reduction.

According to another aspect of embodiments of the present invention, there is provided a method of fabricating a thin film transistor having a top-contact structure, in which a substrate, a gate electrode, a gate insulator layer, a semiconductor layer, source and drain electrodes are sequentially formed. The method is characterized in that, after a coating solution, in which a metal precursor is dissolved in a solvent, is applied on the semiconductor layer, the source and drain electrodes are formed through photo-reduction. Layers other than the source and drain electrodes may be formed through the conventional method, such as vacuum deposition, or the solution process. Particularly, the formation of the gate electrode may be conducted through the solution process, and preferably, after the coating solution in which the metal precursor is dissolved in the solvent is applied on the substrate, the gate electrode is formed through photo-reduction.

The method of embodiments of the present invention is not limited merely to the fabrication of the organic thin film transistor, but may be applied to a fabrication of an inorganic thin film transistor. Particularly, when the method of the present invention is applied to a fabrication of an organic thin film transistor, all layers of the thin film transistor can be formed through the solution process, thus the fabrication is simplified, resulting in a reduced fabrication cost.

Figure 3:
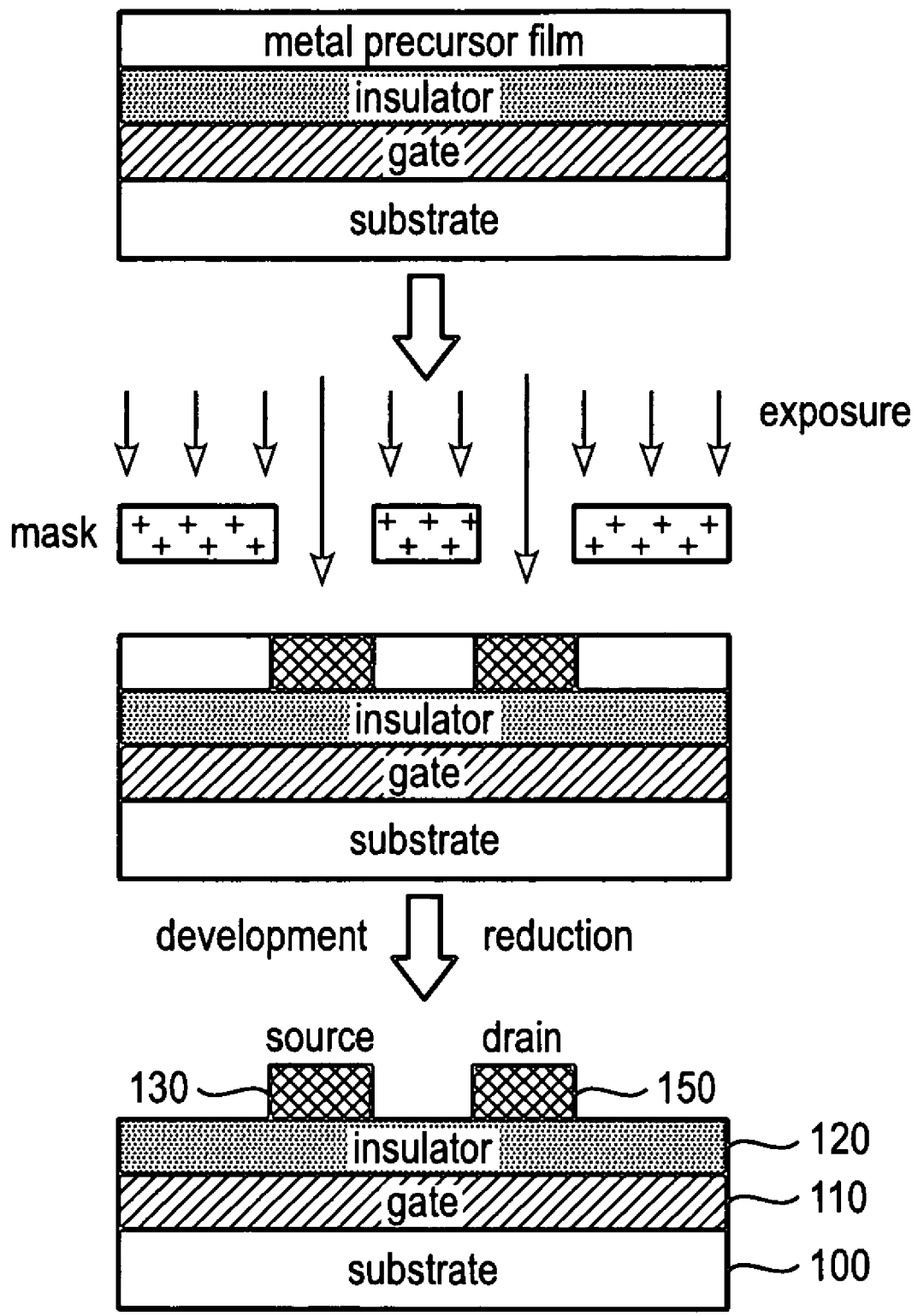
FIG. 3 schematically illustrates a procedure of forming a source electrode and a drain electrode of the thin film transistor, according to a first embodiment of the present invention.

FIG. 3 schematically illustrates the formation of metal patterns for the source electrode and the drain electrode through the solution process according to embodiments of the present invention.

In order to fabricate the organic thin film transistor having the bottom-contact structure as shown in FIG. 1, the source and drain electrodes are formed according to the procedure shown in FIG. 3. First, the gate electrode 110 is formed on the substrate 100, and the insulator layer 120 is formed thereon through the vacuum deposition or the solution process. In the course of forming the insulator layer 120, for example, a polyvinylphenol derivative containing a crosslinking agent is formed in a thickness of 450-650 nm. Subsequently, a soft bake is conducted at about 60-80° C. for about 60-300 sec, and a hard bake is implemented on a hot plate at 120-180° C. for about 30-180 min. Next, an upper side of the insulator layer 120 is coated with a metal (e.g. silver) precursor solution through a spin coating method to form a precursor thin film, and the coated side is then exposed through a mask to conduct a development process in which a portion to be converted into the source and drain electrodes (or the portion other than the source and drain electrodes) is exposed. At this time, UV used during the exposure activates molecules of the source and drain electrode of the exposed portion. After light is radiated, metal of the irradiated portion is reduced, and a non-reduced portion which is not exposed is dissolved in a solvent, such as acetonitrile, thereby finally creating the source electrode 130 and the drain electrode 150. Subsequently, an annealing process may be additionally conducted so as to improve adhesion of the source electrode 130 and the drain electrode 150. For example, heat treatment may be implemented at 80-100° C. for 5 min to increase adhesion of the metal patterns.

Finally, semiconductor material dissolved in the solvent is applied on the source electrode 130 and the drain electrode 150 to form the semiconductor layer 140.

The substrate 100 which is employed to fabricate the thin film transistor of embodiments of the present invention may be made of glass, silicone, or plastic, but is not limited to them.

In the thin film transistor of the present invention, illustrative, but non-limiting examples of material for the insulator layer 120 include inorganics, such as $SiN_x$ ($0 \leq x \leq 4$), $SiO_2$, and $Al_2O_3$, and organics, such as polyvinylphenol, polyolefin, polyvinyl, polyacryl, polystyrene, polyurethane, polyimide, epoxy, derivatives thereof, and blends thereof.

Typical metal or conductive polymer may be used as material for the gate, source, and drain electrodes, and, in detail, non-limiting, illustrative examples of the material include gold (Au), silver (Ag), aluminum (Al), nickel (Ni), indium tin oxide (ITO), polythiophene, polyaniline, polyacetylene, polypyrrole, polyphenylenevinylene, and a PEDOT (polyethylenedioxythiophene)/PSS (polystyrenesulfonate) mixture.

The semiconductor layer 140 of the thin film transistor according to embodiments of the present invention is made of P-type inorganic or organic semiconductor material, or N-type inorganic or organic semiconductor material. Particularly, the N-type organic semiconductor material may be preferably exemplified by fulleroid (1-(3-methoxycarbonyl)propyl-1-phenyl [5,6]$C_{61}$) (F[5,6]), which is expressed by the following Formula 1 and is a derivative of fullerene. Also, another preferred derivative of fullerene is methanofullerene (1-(3-methoxycarbonyl)propyl-1-phenyl [6,6]$C_{61}$) (M[6,6]), which is expressed by the following Formula 2. Conventionally, since it was difficult to apply low molecular weight materials with a solution process, the solution process was conducted after polymer was mixed with the low molecular weight materials, but in the present invention, it is possible to conduct the solution process without using polymer.

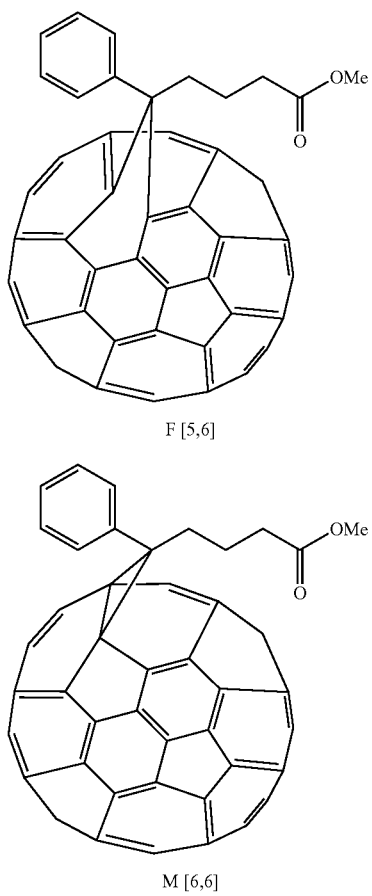

Formula 1
F [5,6]

Formula 2
M [6,6]

In embodiments of the present invention, the formation of the insulator layer, the organic semiconductor layer, and the electrodes through the solution process may be achieved using a dip coating, spin coating, ink-jet printing, spray coating, or roll coating method.

In fabrication of the organic thin film transistor having the top-contact structure, the gate electrode 210 is formed on the predetermined substrate 200 through the solution process. Subsequently, an organic insulator 220 dissolved in a solvent is applied on an upper side of the resulting substrate, which includes the gate electrode 210, through a typical coating method employed in the solution process. In the formation of the insulator layer, for example, a polyvinylphenol derivative containing the crosslinking agent is formed in a thickness of 450-650 nm. Next, a soft bake is conducted at about 60-80° C. for about 60-300 sec, and a hard bake is implemented on a hot plate at 120-180° C. for about 30-180 min. Thereafter, an organic semiconductor 230 is formed on the organic insulator 220.

Subsequently, the source electrode 240 and the drain electrode 250 are formed on an upper side of the organic semiconductor layer 230 through the solution process. In the formation of the source electrode 240 and the drain electrode 250, after a metal precursor is spin coated, an upper side of the coat is exposed using a mask to conduct a development process in which a portion to be converted into the source and drain electrodes (or the portion other than the source and drain electrodes) is exposed. Subsequently, the portion other than portions to be converted into the source and drain electrodes is removed using a solvent, thereby forming the desired source and drain electrodes 240, 250.

The organic thin film transistor fabricated according to the method of the present invention may be used to fabricate display devices, such as electroluminescent devices, liquid crystal devices, or electrophoretic devices.

A better understanding of the embodiments of the present invention may be obtained through the following examples which are set forth to illustrate, but are not to be construed as the limit of the embodiments of the present invention.

Preparation Example of a Metal Precursor Solution for Forming Electrodes

In the present preparation example, all processes were conducted in a nitrogen gas atmosphere using a vacuum dry box equipped with a Dri-Train gas purifier (Model HE 493), or in a vacuum using a standard Schlenk technology. A Reagent grad solvent was distilled in a nitrogen gas atmosphere using a proper drying agent, and preserved on an activated molecular sieve 4 Å, from which gas was removed before use. n-propyl amine and n-butyl amine purchased from Aldrich Co., Ltd. were treated with $CaH_2$ for one day or more, and filtered primary amines were distilled with $CaH_2$ if they were required to be used immediately. Silver (I) salts and other compounds were used as received after they were purchased from Aldrich Co., Ltd.

(n-$PrNH_2$)Ag($NO_2$) as a metal precursor solution for fabricating source and drain electrodes was produced through the following procedure. An excessive amount of n-propyl amine (3.60 g, 60 mmol) was added in drops to a solution, in which $AgNO_2$ (1.53 g, 10 mmol) was dissolved in 20 ml of $CH_3CN$, in a dark room. A reactant mixture was agitated at room temperature for 4 hours to produce a small amount of brown precipitate and a light yellow solution. After filtration was conducted using a 0.2 m PTFE membrane filter, a volume of filtrate was reduced to about 5 ml, and 50 ml of $Et_2O$ was added thereto. The resulting solution was filtered, and all volatile organics were vaporized at room temperature in a vacuum to produce light yellow oil (1.9 g). $^1$H-NMR ($CD_3CN$, ppm): 2.69 [t, 2H, N—$CH_2$], 1.50 [m, 2H, $CH_2CH_3$], 0.90 [t, 3H, $CH_2CH_3$]. Anal. Calcd for $C_3H_9N_2O_2Ag.0.5CH_3CN$: C, 20.57; H, 4.53; N, 15.00. Found: C, 19.81; H, 4.51; N, 14.82.

Example 1

Fabrication of an Organic Thin Film Transistor Having a Bottom-Contact Structure Through a Solution Process In the present example, the organic thin film transistor having the bottom-contact structure shown in FIG. 1 was fabricated. The source and drain electrodes were formed through the procedure shown in FIG. 3. First, a glass substrate, on which a gate electrode was formed in a thickness of 1500 Å by depositing AlNd using an electronic beam, was used, and washed using semiconductor level acetone and methanol solvents in a ultrasonic washing machine. Polyvinylphenol-based insulating material containing a crosslinking agent was applied in a thickness of 5500 Å as an insulator layer through a spin coating method at 3000 rpm, and baking was then conducted at 110° C. for 5 min and at 150° C. for 2 hours. The insulator was not dissolved in an organic solvent after the baking. Subsequently, a silver precursor was applied on the insulator through the spin coating method, and UV irradiated through a photomask having a channel length of 50 Å and a channel width of 2 mm. After the irradiation, silver was reduced at an irradiated portion, and an unreduced portion, which was not exposed, was dissolved with acetonitrile, thereby creating the source and drain electrodes as shown in FIG. 1. Heat treatment was implemented at 80-100° C. for 5 min so as to improve adhesion of the metal patterns. The resulting patterns were 50-70 nm in thickness. Subsequently, 1 wt % PCBM ([6,6]-phenyl-$C_{61}$ butyric acid methyl ester) was dissolved in a chlorobenzene solvent and applied in a thickness of 70-110 nm using a spin coater at 1000 rpm to form a thin film. Next, heat treatment was conducted at 70-80° C. for about 3 hours in a vacuum to remove the solvent and thus form an organic semiconductor layer, thereby creating the thin film transistor having the bottom-contact structure.

Figure 4:
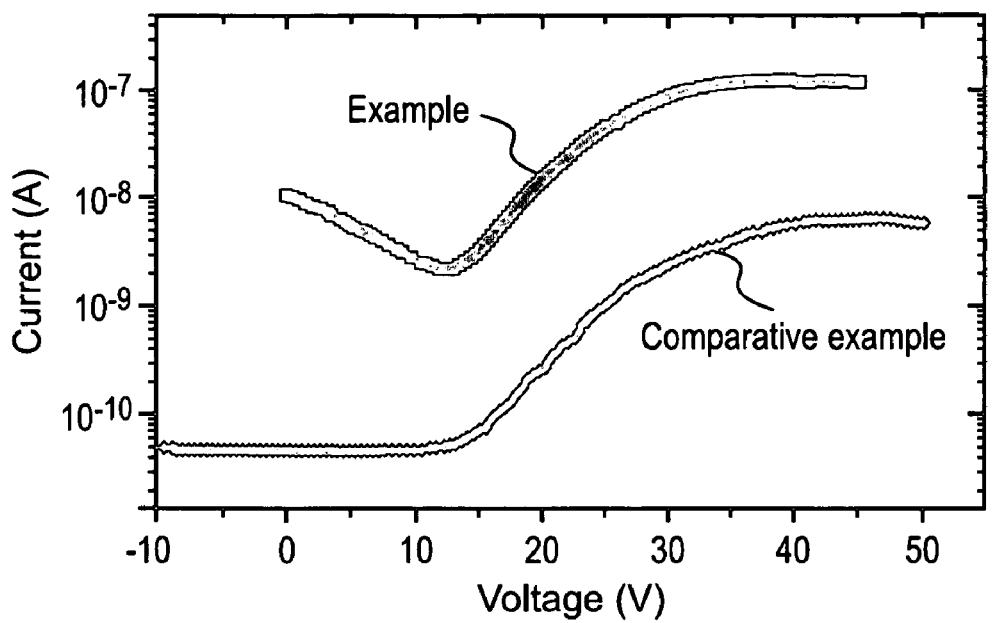
FIG. 4 is a graph comparatively showing current transfer characteristics of organic thin film transistors which are fabricated according to the examples and comparative example.
Figure 5:
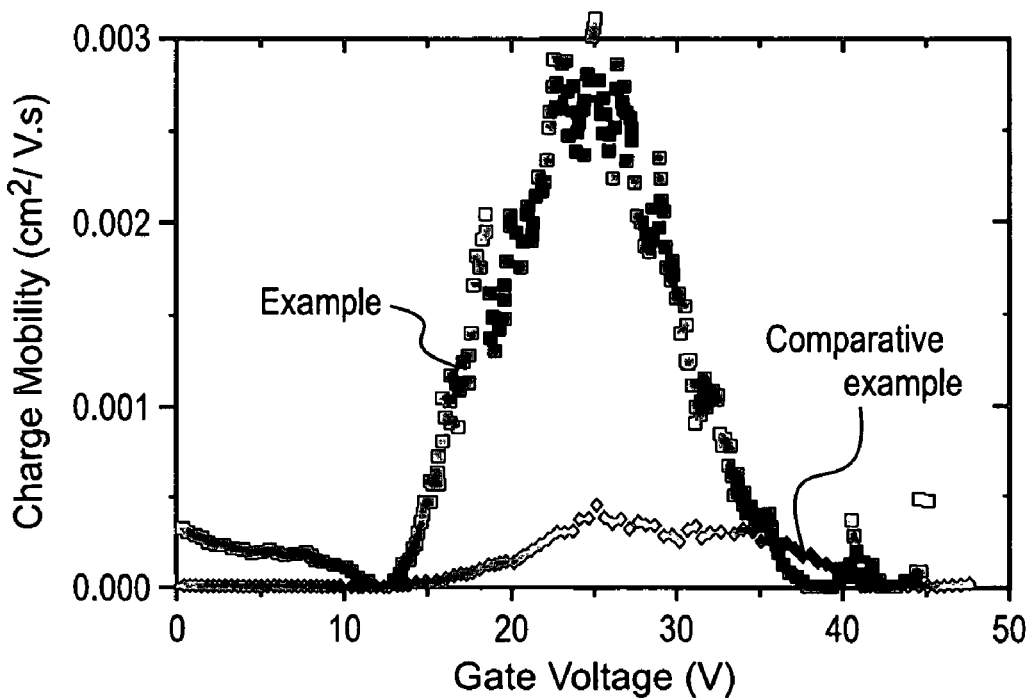
FIG. 5 is a graph comparatively showing charge mobilities of the organic thin film transistors which are fabricated according to the examples and comparative example.

Current transfer characteristics of the organic thin film transistor thus produced were evaluated using a KEITHLEY semiconductor analyzer (4200-SCS), and were shown in graphs of FIGS. 4 and 5. From these, electrical properties were measured through the following methods and described in the following Table 1.

A graph having $(I_{SD})^{1/2}$ and $V_G$ as variables was obtained from the following source-drain current versus the gate voltage equations at the saturation region, and charge mobility was determined from the slope of the graph:

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET} = (\text{slope})^2 \frac{2L}{C_0 W}$$

In the above equations, $I_{SD}$ is a source-drain current, $\mu$ or $\mu_{FET}$ is charge mobility, $C_o$ is a capacitance of a gate insulator film, W is a channel width, L is a channel length, $V_G$ is a gate voltage, and $V_T$ is a threshold voltage.

An $I_{on}/I_{off}$ current ratio was obtained from the ratio of maximum current value in an on-state to minimum current value in an off-state. Meanwhile, the $I_{on}/I_{off}$ current ratio is expressed by the following equation.

$$\frac{I_{on}}{I_{off}} = \left(\frac{\mu}{\sigma}\right)\frac{C_0^2}{qN_A t^2}V_D^2$$

In the above equation, $I_{on}$ is the maximum current value, $I_{off}$ is an off-state leakage current, $\mu$ is charge mobility, $\sigma$ is conductivity of the thin film, q is the quantity of electric charge, $N_A$ is a charge density, t is a thickness of a semiconductor film, $C_o$ is a capacitance of an oxide film, and $V_D$ is a drain voltage.

Comparative Example 1

Fabrication of an Organic Thin Film Transistor Having a Bottom-Contact Structure Through a Conventional Vacuum Deposition Process The procedure of example 1 was repeated except that gold was vacuum plated in a thickness of 50 nm using a shadow mask having a channel length of 100 Å and a channel width of 1 mm to form the source and drain electrodes. A current transfer characteristic curve and charge mobility of a fabricated device were obtained and shown in FIGS. 4 and 5, respectively. Its electrical properties were measured through the same method as example 1 and described in the following Table 1.

Example 2

Fabrication of an Organic Thin Film Transistor Having a Top-Contact Structure Through a Solution Process In the present example, the organic thin film transistor having the top-contact structure shown in FIG. 2 was fabricated. A source electrode and a drain electrode were formed through the procedure shown in FIG. 3. First, a glass substrate, on which a gate electrode was formed in a thickness of 1500 Å by depositing AlNd using an electronic beam, was used, and washed using semiconductor level acetone and methanol solvents in a ultrasonic washing machine. Polyvinylphenol-based insulating material containing a crosslinking agent was applied in a thickness of 5500 Å as an insulator layer through a spin coating method at 3000 rpm, and baking was then conducted at 110° C. for 5 min and at 150° C. for 2 hours. The insulator was not dissolved in an organic solvent after the baking. Subsequently, 1 wt % PCBM ([6,6]-phenyl-$C_{61}$ butyric acid methyl ester) was dissolved in a chlorobenzene solvent and applied in a thickness of 70-110 nm using a spin coater at 1000 rpm to form a thin film. Next, heat treatment was conducted at 70-80° C. for about 3 hours in a vacuum to remove the solvent and thus form an organic semiconductor layer.

Subsequently, a silver precursor was applied on the insulator through the spin coating method, and UV irradiated through a photomask having a channel length of 50 Å and a channel width of 2 mm. After the irradiation, silver was reduced at an irradiated portion, and an unreduced portion which was not exposed was dissolved with acetonitrile, thereby creating the source and drain electrodes. Heat treatment was implemented at 80-100° C. for 5 min so as to improve adhesion of the metal patterns. The resulting patterns were 50-70 nm in thickness. Thereby, the organic thin film transistor having the top-contact structure was created.

TABLE 1

|  | Charge mobility (cm$^2$/V$_s$) | Threshold voltage (V) |
|---|---|---|
| Example 1 | 0.003 | 15.8 |
| Example 2 | 0.03 | 13.5 |
| Comparative example 1 | 0.0004 | 17.5 |

From the results of the above Table 1, it can be seen that the organic thin film transistor fabricated according to the methods of embodiments of the present invention has excellent electrical properties, such as charge mobility, even though all stages are conducted through the low-cost solution process. Thus it can be used in applications requiring high speed response and low voltage driving.

As described above, in a method of fabricating a thin film transistor according to the present invention, a gate electrode, a source electrode, and a drain electrode are formed through a solution process, thereby preventing damage to an insulator or organic semiconductor layer due to metal diffusion. Furthermore, all stages are conducted through the solution process, thus it is possible to fabricate the organic thin film transistor having high charge mobility while a simplified process and reduced expenditure are assured.

Although preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A display device having a thin film transistor, comprising:
   a substrate,
   a gate electrode,
   a gate insulator layer,
   a photo-reduced drain electrode,
   a photo-reduced source electrode, and
   a semiconductor layer,
   wherein said source electrode and said drain electrode are photo-reduced by applying a coating solution, in which a metal precursor is dissolved in a solvent, on one of the semiconductor layer and the gate insulator layer, and drying the solvent.

2. The device as set forth in claim 1, wherein the gate electrode is formed by: applying a coating solution, in which a metal precursor is dissolved in a solvent, on the substrate; and forming the gate electrode through photo-reduction.

3. The display device as set forth in claim 1, wherein the substrate, the gate electrode, the gate insulator layer, the semiconductor layer, and the drain and source electrodes are in the recited sequence.

4. The display device as set forth in claim 1, wherein the substrate, the gate electrode, the gate insulator layer, the drain and source electrodes and the semiconductor layer are in the recited sequence.

5. The device as set forth in claim 1, wherein the semiconductor layer is a P-type or N-type inorganic semiconductor material or a P-type or N-type organic semiconductor material.

6. The device as set forth in claim 5, wherein the semiconductor layer is an N-type organic semiconductor material and the N-type organic semiconductor material is fulleroid (1-(3-methoxycarbonyl)propyl-1-phenyl [5,6] C61) (F[5,6]) expressed by the following Formula 1:

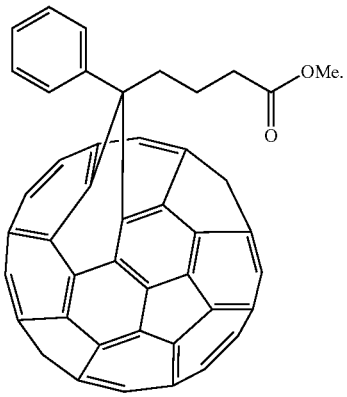

F [5,6]

7. The device as set forth in claim 5, wherein the semiconductor layer is an N-type organic semiconductor material and the N-type organic semiconductor material is methanofullerene (1-(3-methoxycarbonyl)propyl-1-phenyl [6,6] C61) (M[6,6]) expressed by the following Formula 2:

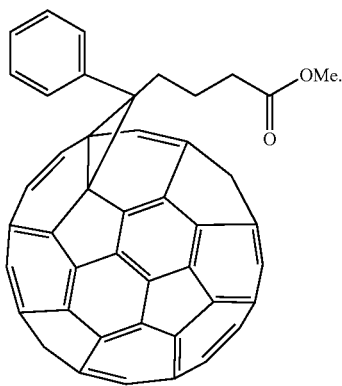

M [6,6]

8. The device as set forth in claim 5, wherein the semiconductor layer is a P-type organic semiconductor material and the P-type organic semiconductor layer is made of a material selected from the group consisting of pentacene, copper phthalocyanine, polythiophene, polyaniline, polyacetylene, polypyrrole, polyphenylenevinylene, and a derivative thereof.

9. The device as set forth in claim 1, wherein the gate insulator layer is made of a material selected from the group consisting of polyolefin, polyvinyl, polyacryl, polystyrene, polyurethane, polyimide, polyvinylphenol, epoxy, derivatives thereof and the blends thereof, $SiO_x$, $SiN_x$, and $Al_2O_3$.

10. The device as set forth in claim 1, wherein the gate electrode, the source electrode, and the drain electrode are made of the metal precursor selected from the group consisting of gold, silver, aluminum, nickel, and copper.

11. The device as set forth in claim 1, wherein the source electrode and the drain electrode are made of the metal precursor selected from the group consisting of gold, silver, aluminum, nickel, and copper.

12. The device as set forth in claim 1, wherein the gate electrode are made of the metal precursor selected from the group consisting of gold, silver, aluminum, nickel, and copper.

13. The device as set forth in claim 1, wherein the substrate is made of a material selected from the group consisting of glass, silicone, and plastic.

14. The device as set forth in claim 1, wherein the coating solution, in which the metal precursor is dissolved in the solvent, is applied using dip coating, spin coating, ink-jet printing, spray coating, or roll coating.

* * * * *